United States Patent
Hui et al.

(10) Patent No.: US 9,220,186 B2
(45) Date of Patent: Dec. 22, 2015

(54) INTEGRATED DIRECT COUPLE HEAT SINK AND SHOCK/VIBRATION PROTECTION

(71) Applicant: Cooper Technologies Company, Houston, TX (US)

(72) Inventors: John T Hui, San Jose, CA (US); Stephen D Howes, San Jose, CA (US); Stephen J Teves, Santa Clara, CA (US)

(73) Assignee: Cooper Technologies Company, Houston, TX (US)

( * ) Notice: Subject to any disclaimer, the term of this patent is extended or adjusted under 35 U.S.C. 154(b) by 363 days.

(21) Appl. No.: 13/762,706

(22) Filed: Feb. 8, 2013

(65) Prior Publication Data
US 2013/0208428 A1    Aug. 15, 2013

Related U.S. Application Data

(60) Provisional application No. 61/597,312, filed on Feb. 10, 2012.

(51) Int. Cl.
*H05K 7/20* (2006.01)
*H05K 5/00* (2006.01)
*H05K 5/02* (2006.01)

(52) U.S. Cl.
CPC .......... *H05K 7/20418* (2013.01); *H05K 5/0017* (2013.01); *H05K 5/0217* (2013.01); *Y10T 29/49826* (2015.01)

(58) Field of Classification Search
USPC .......................................... 361/720, 681, 683
See application file for complete search history.

(56) References Cited

U.S. PATENT DOCUMENTS

| | | | |
|---|---|---|---|
| 5,559,671 A * | 9/1996 | Dan et al. ........................ | 248/562 |
| 6,350,964 B1 * | 2/2002 | Boas et al. ....................... | 219/390 |
| 6,842,333 B2 * | 1/2005 | Lee et al. ................. | 361/679.55 |
| 7,254,014 B2 | 8/2007 | Cancellieri et al. | |
| 7,447,034 B2 | 11/2008 | Shin | |
| 8,964,298 B2 * | 2/2015 | Haddick et al. ............... | 359/630 |
| 2014/0198456 A1 * | 7/2014 | Bose et al. ..................... | 361/720 |

* cited by examiner

*Primary Examiner* — Andargie M Aychillhum
(74) *Attorney, Agent, or Firm* — IP Authority, LLC; Ramraj Soundararajan

(57) ABSTRACT

The rear cover of an electronics device is made up of two sections including an external heat sink and a rear cover frame. The electronics for the computing device are directly coupled to the heat sink section. The two sections are fastened together with a layer of cushioning material to simultaneously provide shock-vibration protection as well as efficient cooling of the electronics.

11 Claims, 14 Drawing Sheets

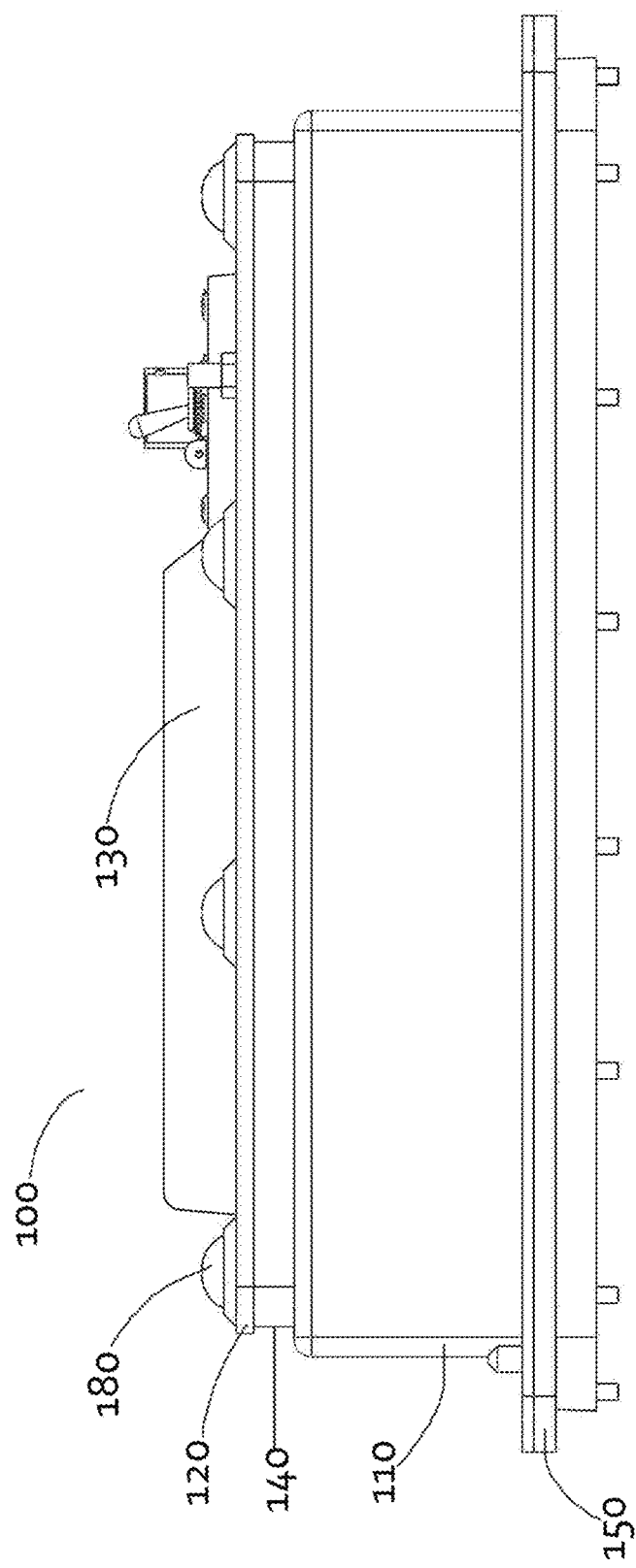

INTEGRATED DIRECT COUPLE HEAT SINK AND SHOCK/VIBRATION PROTECTION

RELATED APPLICATIONS

This application claims priority from U.S. Provisional Application 61/597,312 filed Feb. 10, 2012.

BACKGROUND OF THE INVENTION

1. Field of Invention

The present invention relates generally to the field of electronics device packaging. More specifically, the present invention is related to a method and apparatus for vibration and shock isolating electronics while maintaining optimal thermal performance as provided by the direct couple heat source to heat sink approach.

2. Discussion of Prior Art

Displays and computers employed in mission critical shipboard applications must be ruggedized to an extent that they can remain operational after very violent shock and vibration events. These events can occur during combat because of weapon strikes or during any other potentially catastrophic system failure. When these events occur it is vital that critical systems on the ship remain operational. Therefore, the U.S. government has established testing guidelines that simulate these events to ensure that vital electronics are properly designed to meet the requirements. One example standard is MIL-S-901D. There are other similar standards in other countries.

In order to pass the required tests to meet MIL-S-901D requirements, most electrical systems need some mechanical protection to limit the degree of shock energy transferred to the components or to strengthen the components sufficiently to survive the energy transferred. Known methods to do this include vibration isolation mounting, rigid encapsulation with sealants or adhesives, heavy mechanical braces & mounting, or combinations of these methods. FIGS. 1A-B show a prior art example of internal vibration mounting with internal shock/vibration mounts 10.

These methods all have disadvantages including added weight, cost, and often they increase total footprint of the components being protected. Many times, the internal space required for isolation mounts makes the outside enclosure size unacceptably large for the target application.

An additional drawback to the internal shock mounting approach is that it is much harder to transfer the heat from high power components to the outside of the case when the components are shock isolated. Only convection cooling methods can practically be employed. If any direct conduction cooling approaches are attempted, the design runs the risk of transferring significant shock energy to the components.

Another technique often employed is to shock isolate the entire sub-assembly, in this case the entire display. In this approach, the scheme to mount the display into the final application is significantly burdened by increased size, weight, complexity and additional cost. This approach does, however provide shock/vibration protection to the electronics while still allowing the electronics to be directly coupled to the external enclosure for better heat dissipation. FIGS. 2A-C show a prior art example of external shock mounting with external shock/vibration mount 20.

U.S. Pat. No. 7,254,014 to Cancellieri et al. describes a housing for display electronics with gaskets to provide shock protection and cooling fins on the rear of the assembly. However, Cancellieri et al. do not implement or suggest a floating sub-assembly to protect the internal electronics from shock while simultaneously providing excellent heat transfer to the exterior of the enclosure.

U.S. Pat. No. 7,447,034 to Shin describes a sheet of heat conducting material used to isolate any vibrations induced by the electronics from the rest of the case, while still promoting good heat flow to the external case. However, the electronics are still rigidly mounted to the "chassis" base which is then directly mounted to the case of the unit.

Whatever the precise merits, features, and advantages of the prior art, none of them achieves or fulfills the purposes of the present invention.

SUMMARY OF THE INVENTION

A shock/isolation mount is made with a rear enclosure attached to a mounting flange. The rear enclosure also has a heat sink attached to it with cushioning material interposed between the rear enclosure and the heat sink. In one embodiment, the mount houses an electronics board on an electrically insulating polycarbonate platform directly coupled to the heat sink. In one embodiment, the heat sink is attached to the rear enclosure of the mount using shoulder bolts and shock/vibration isolation washers. In another embodiment, the electronics board controls a display, such as a touch screen display, that is also mounted to the mounting flange.

A second aspect of this invention is a method for making a shock/isolation mount for an electronics board by interposing cushioning material between the rear enclosure covering the electronics board and a heat sink for the electronics board. In one embodiment, the heat sink is attached to the rear enclosure by shoulder bolts and shock/vibration isolation washers. In another embodiment, the electronics board controls a computer display or a touch screen display, which is also attached to the mounting flange.

A preferred embodiment of this invention is a shock/vibration isolation shipboard mount for a touch screen display in a naval ship. The mount allows the display to pass a MIL-S-901D shock test, but does not increase the footprint of the mount over a conventional shipboard mount.

BRIEF DESCRIPTION OF THE DRAWINGS

FIG. 3 illustrates an external profile view of the present invention.

DESCRIPTION OF THE PREFERRED EMBODIMENTS

Figure 1A:
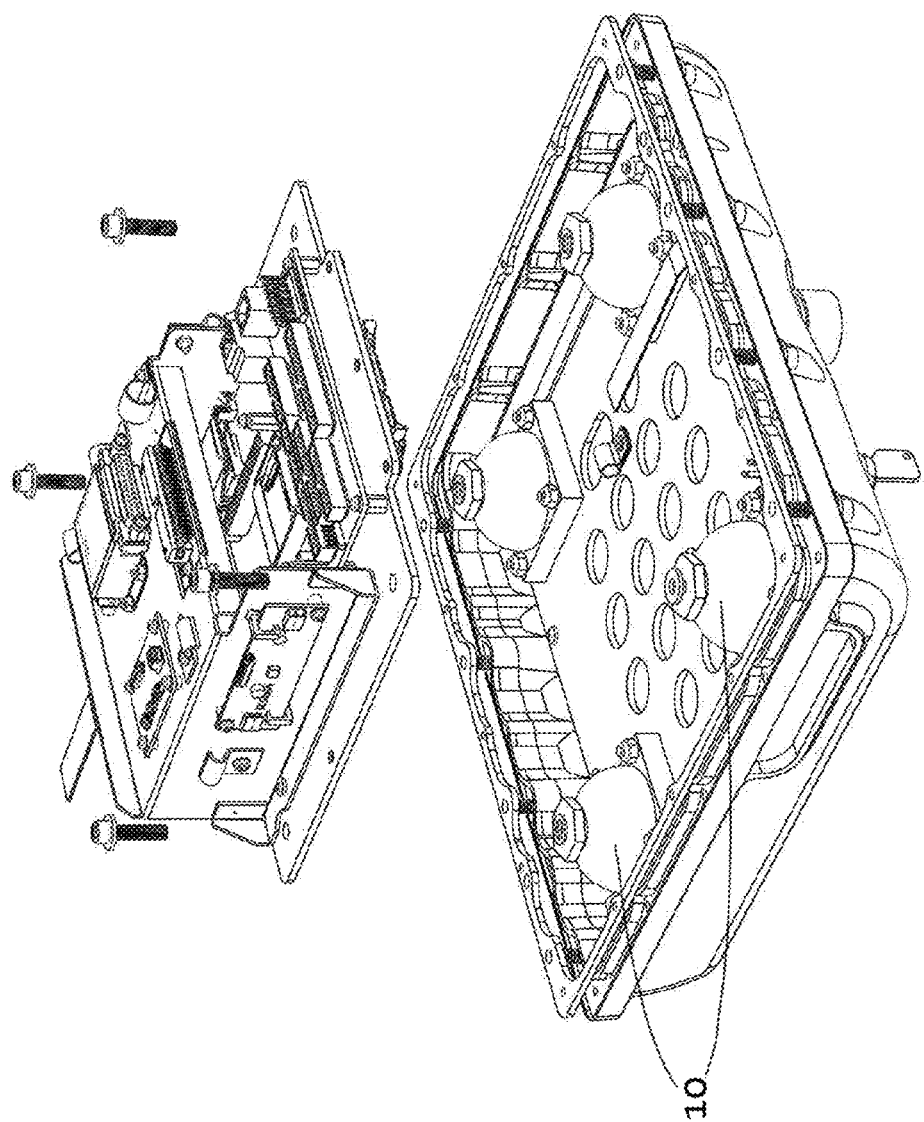
FIGS. 1A and 1B illustrate a prior art embodiment of an internal shock-vibration mounting.
Figure 1B:
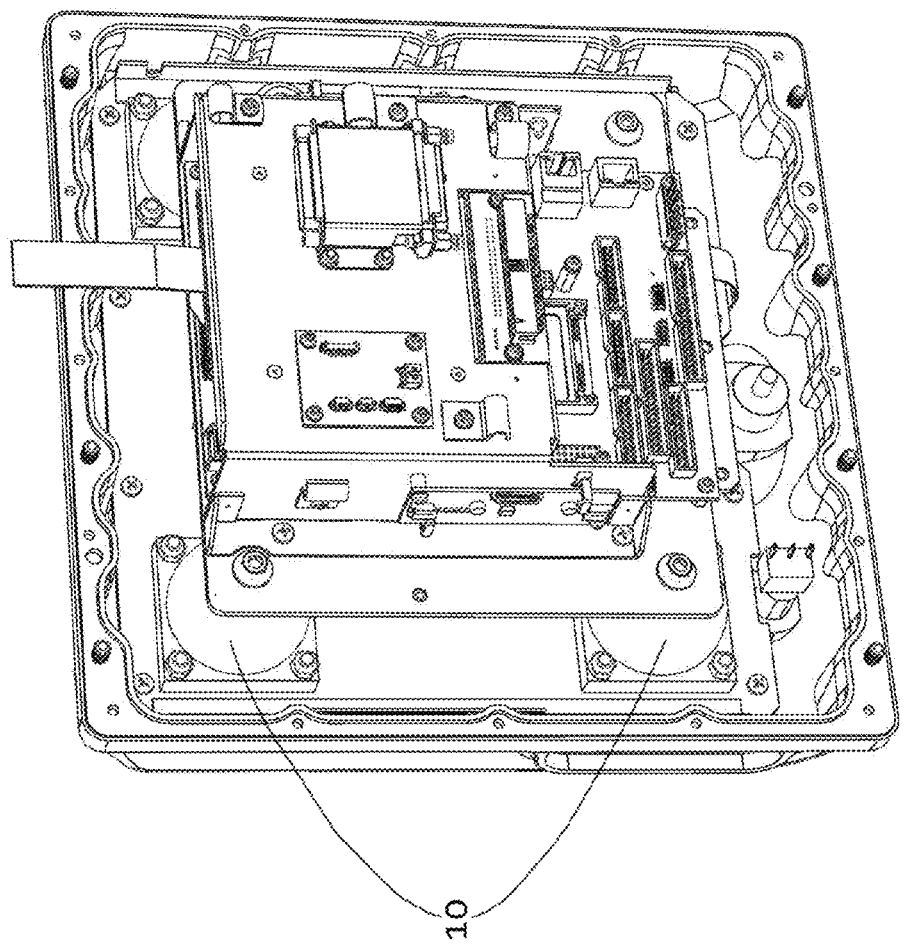
Figure 2A:
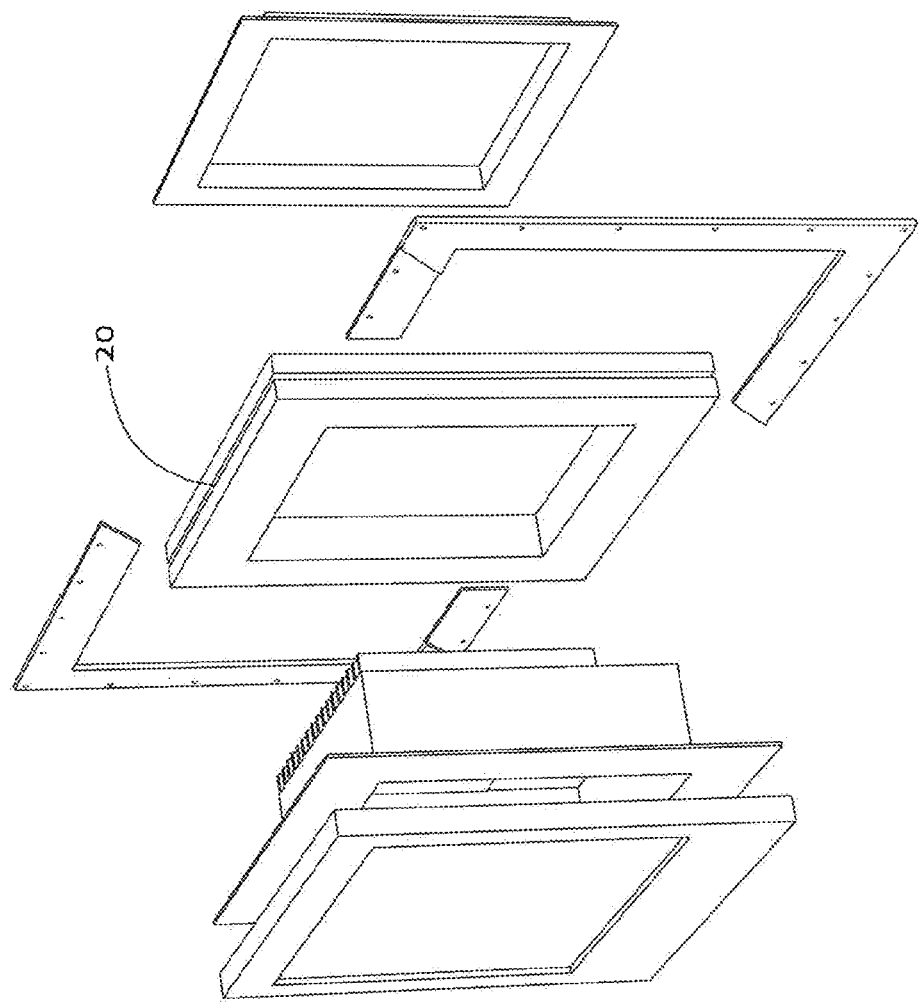
FIGS. 2A-C illustrate a prior art embodiment of an external shock mounting.
Figure 2B:
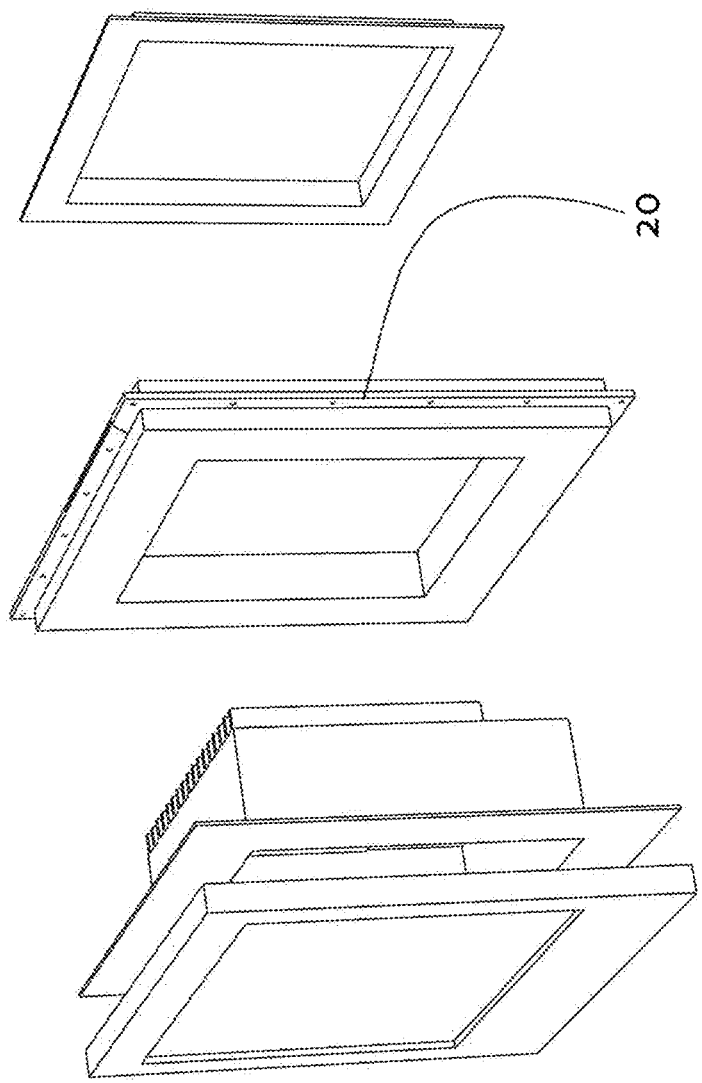
Figure 2C:
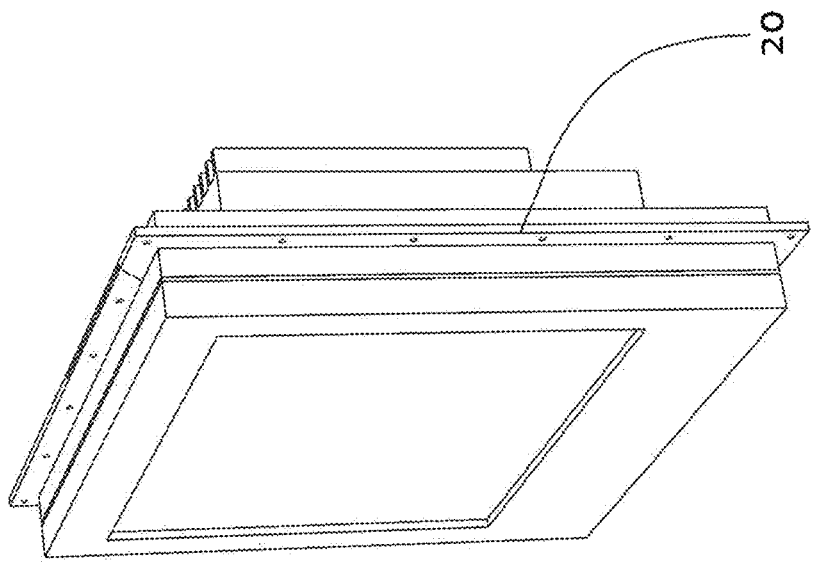

The present invention provides for vibration and shock isolation of packaged electronics within the same mechanical footprint as non-isolated electronics. Preferably the invention will be used as part of a standard platform shipboard display. The package integrates the vibration/shock isolation directly into the mechanical structure of the rear cover of the display. It is anticipated that this approach would support other similar implementations in a variety of enclosure configurations.

While this invention is illustrated and described in a preferred embodiment, the device may be produced in many different configurations, forms and materials. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Figure 4:
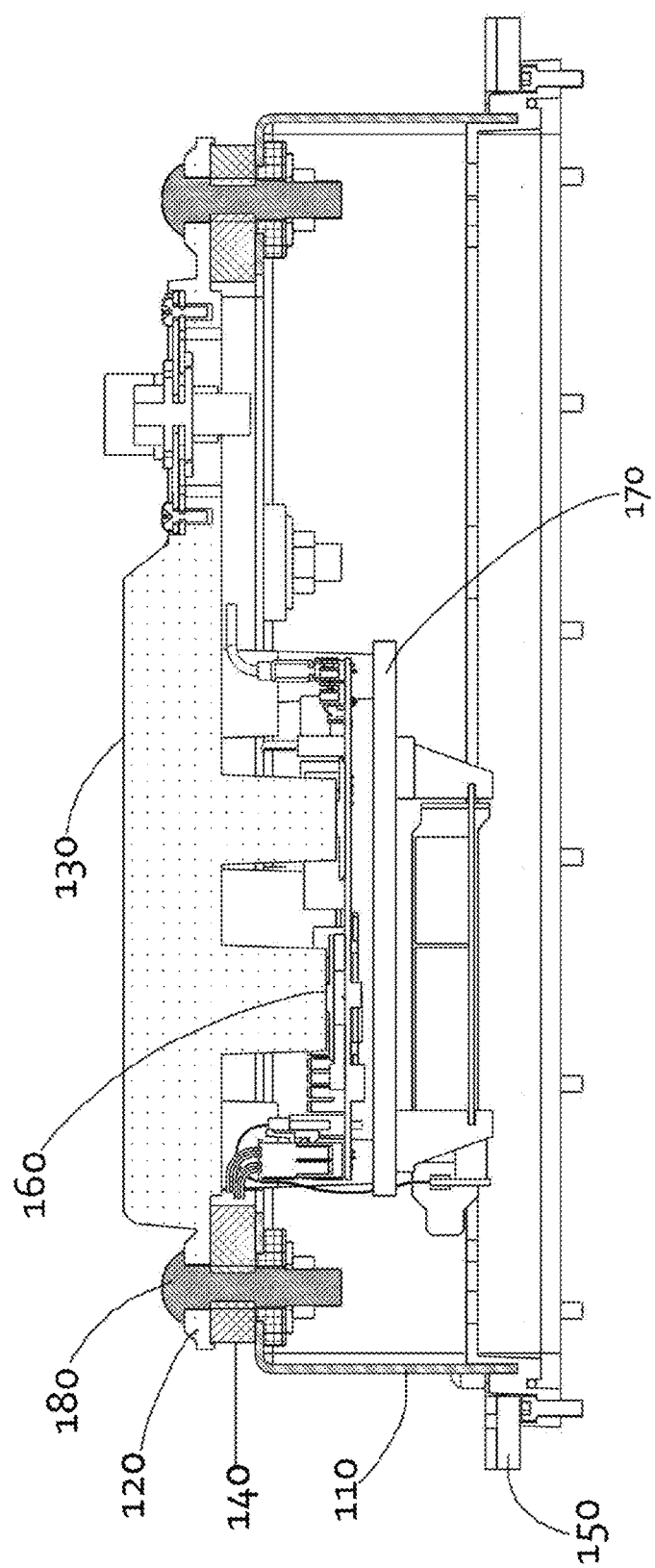
FIG. 4 illustrates a cutaway profile view of the present invention.
Figure 5:
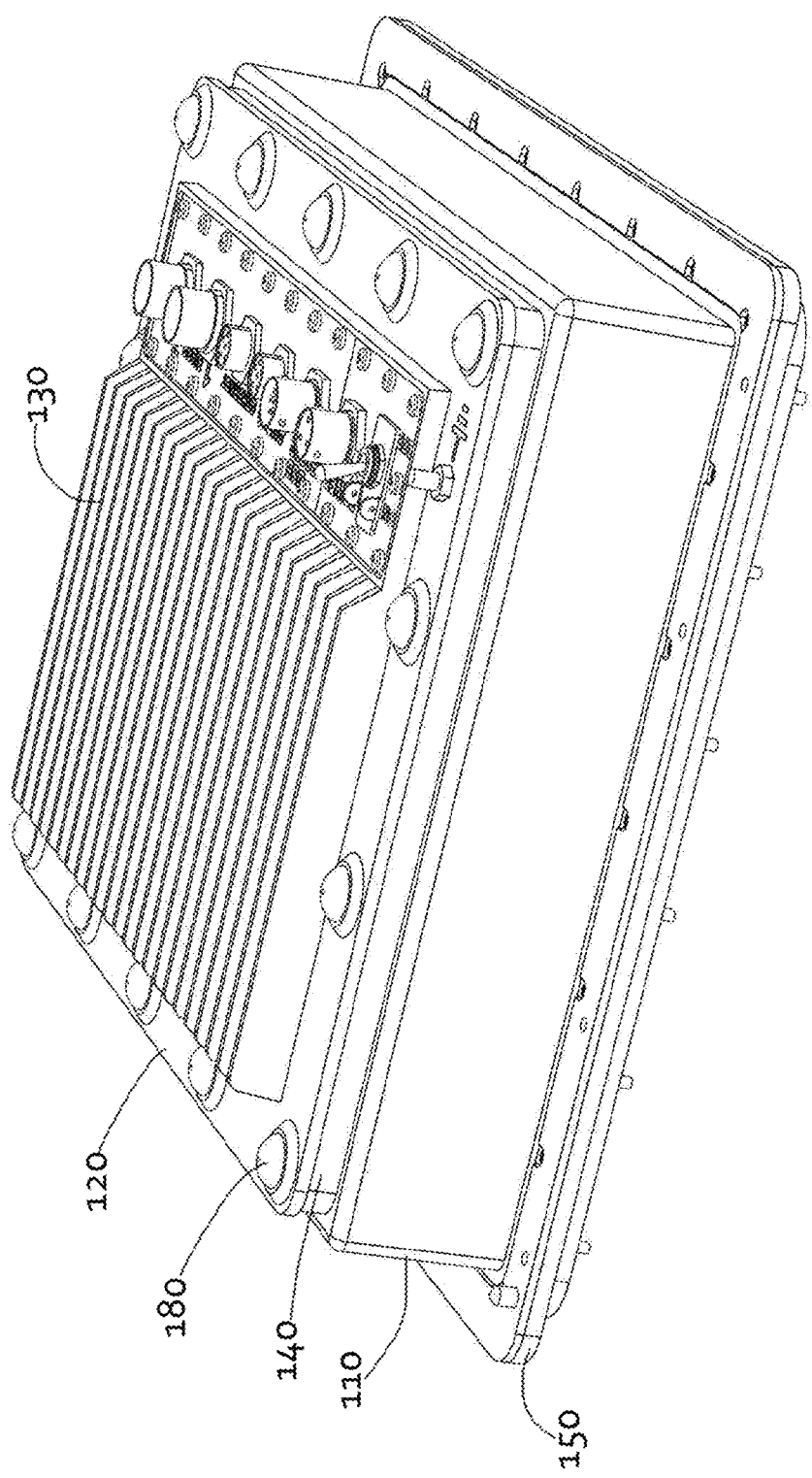
FIG. 5 illustrates a perspective rear view of the present invention.
Figure 6:
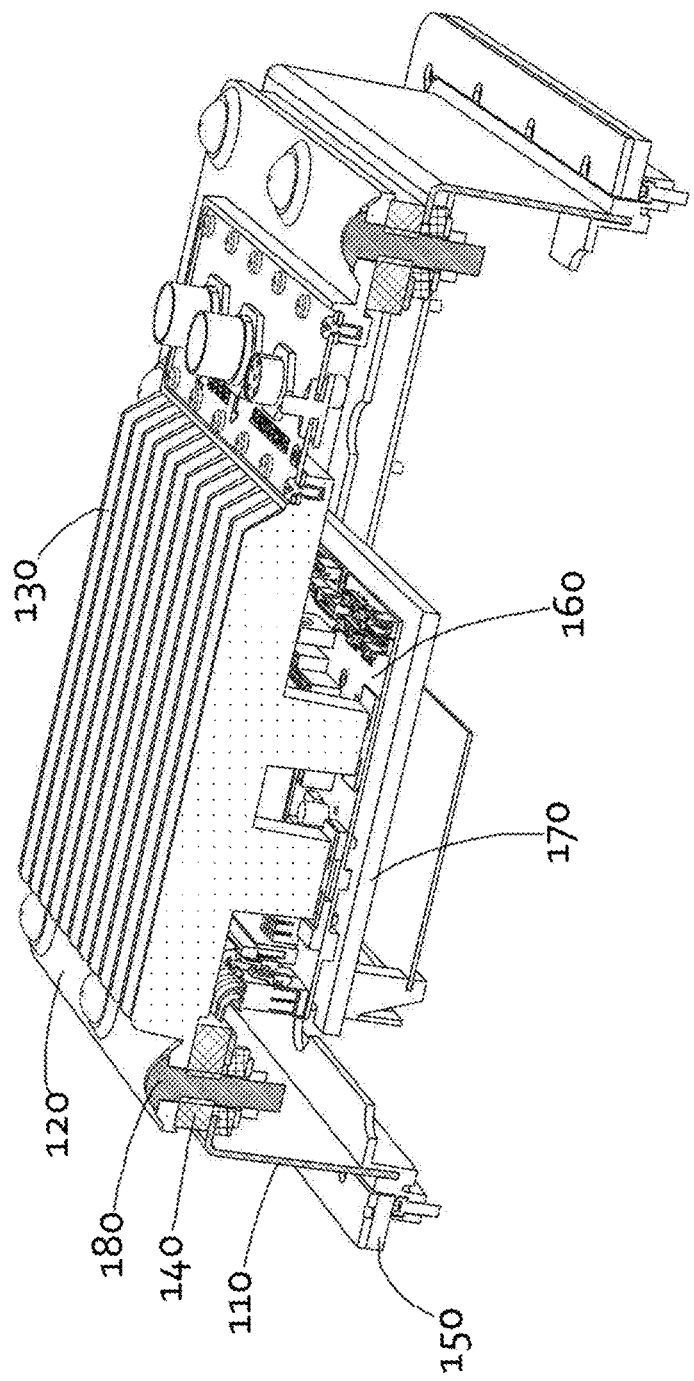
FIG. 6 illustrates a perspective cutaway view of the present invention.

FIGS. 3 and 4 illustrate the profile view of one embodiment of the present invention. The rear cover 100 is broken into two sections 110 and 120. Section 120 comprises a large heat sink 130 covering the back of the rear cover 100. Section 110 is the side and corners of the rear cover 100. The heat sink section 120 is mounted to the outside of the rear enclosure 110 with a layer of cushioning material 140 at the interface. Cushioning material 140 incorporates dual properties of providing a shock-vibration energy absorbing interface as well as providing a rugged environmental seal. In one embodiment, cushioning material 140 comprises medium density cellular foam.

When properly mounted, shock energy is transferred through the rear enclosure 110 from the mounting flange 150 but is partially absorbed by the energy absorbing interface 140 before it reaches the heat sink rear section 120 where sensitive electronics 160 are mounted.

Inside the cover, the electronics 160 are directly coupled on the rear heat sink section 120 allowing for very efficient conductive cooling of the hot components. The electronics 160 are also protected from shock and vibration as they are mounted only to the rear heat sink section 120. This accomplishes a solution to the multiple problems of the prior art.

Figure 7:
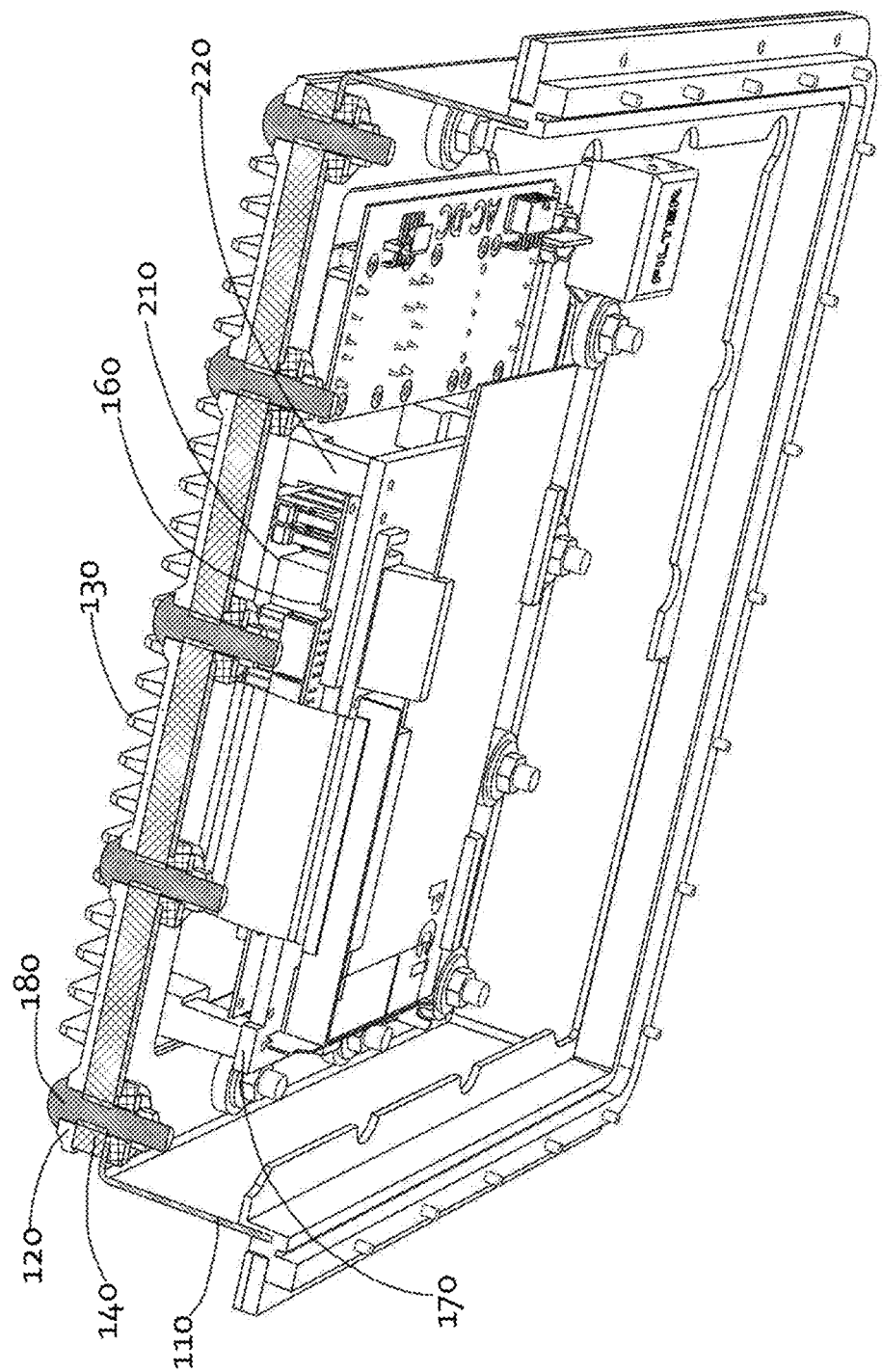
FIG. 7 illustrates a perspective section view of the interior of the present invention.

FIG. 7 shows a zoomed in cutaway view of the inside of rear cover with rear cover section 120 and heat sink 130 mounted to rear cover section 110 through cushioning material 140. Section 120 is attached to section 110 with shoulder bolts 180, which control the compression of cushioning material 140. The shoulder bolts fit through shock-vibration grommets and have washers to spread the load on section 110. Heat sources in electronics 160 are directly coupled to blocks 210 on heat sink 130. Electronics 160 are mounted on polycarbonate platform 170 to electrically isolate the electronics from the metal housing. This assembly (160, 170) is mounted to blocks 220 to maximize protection from the MIL-S-901D shock test. Heat sink 130 sits external to rear cover section 120 to maximize its cooling ability to open air.

Figure 8:
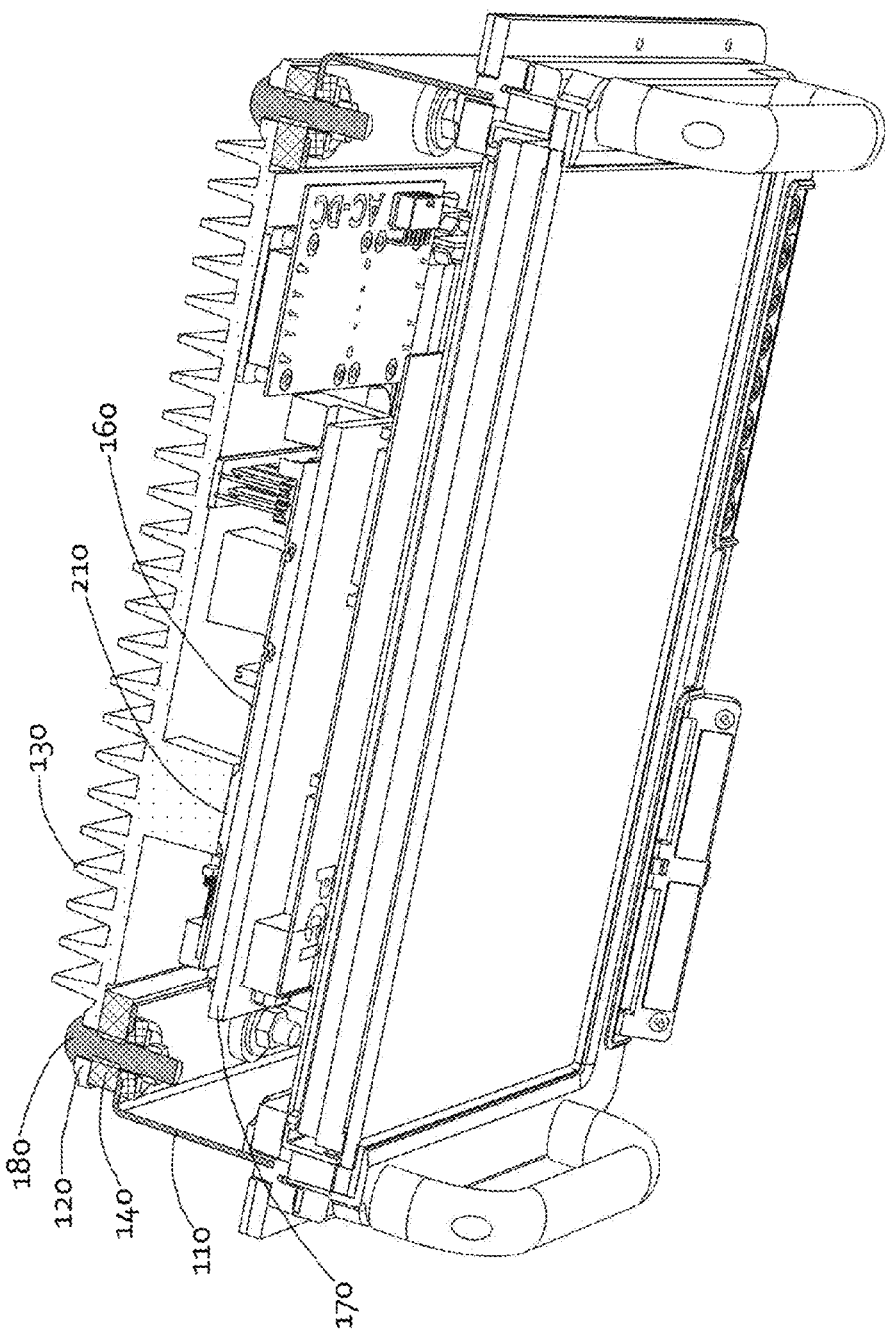
FIG. 8 illustrates a perspective cutaway view of one embodiment of mounting the present invention in a shipboard application.
Figure 9:
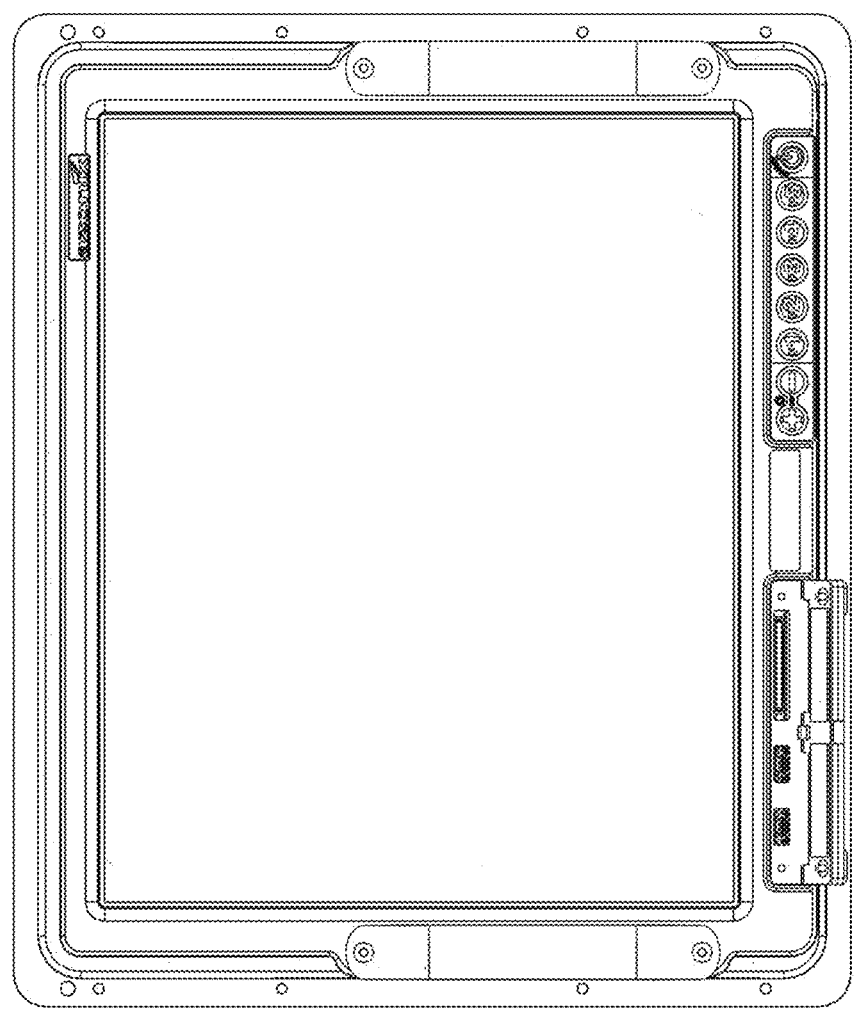
FIG. 9 illustrates a front view of one embodiment of the present invention.
Figure 10:
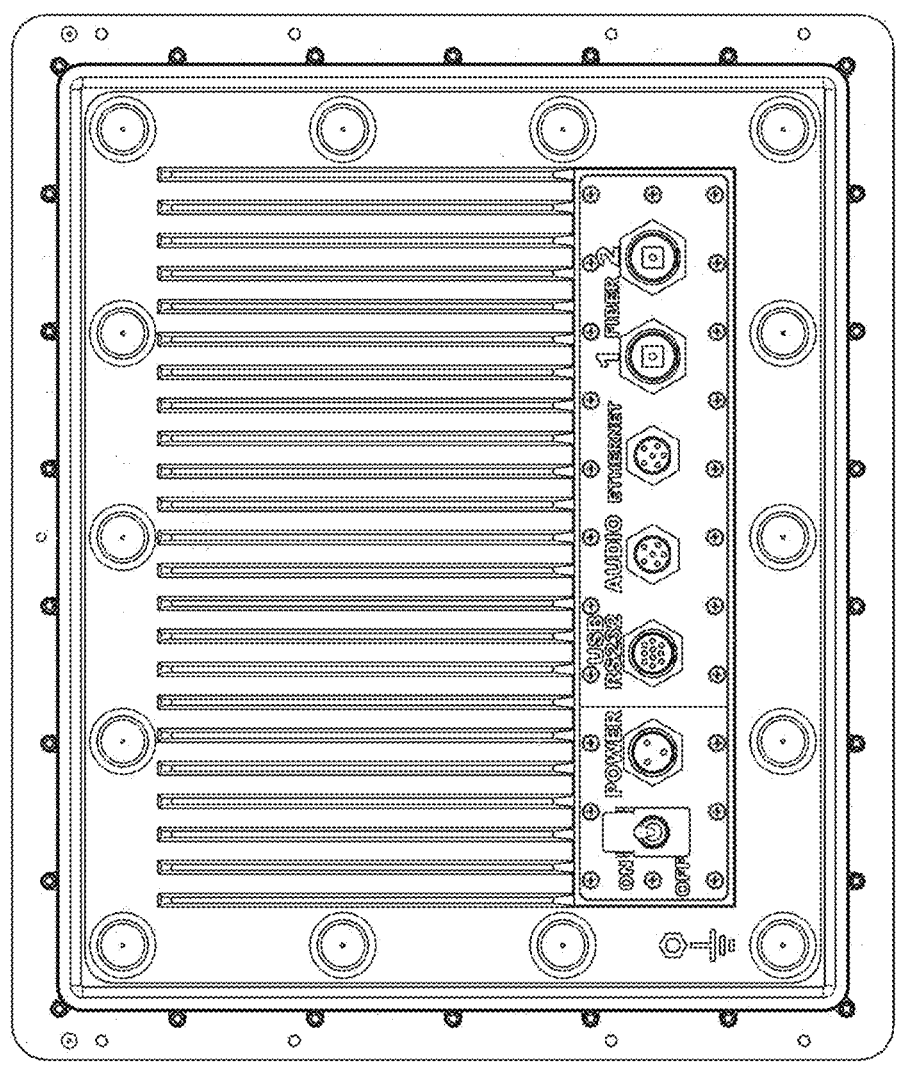
FIG. 10 illustrates a rear view of one embodiment of the present invention.
Figure 11:
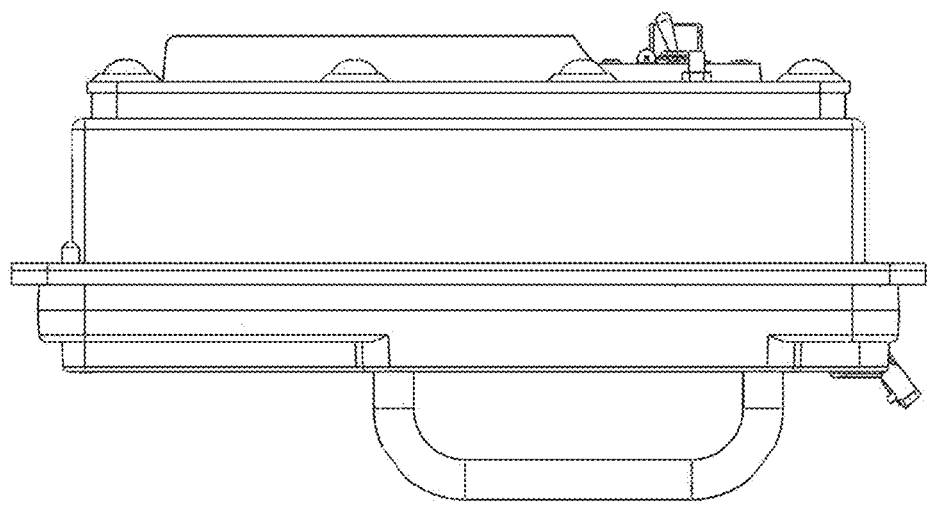
FIG. 11 illustrates a side view of one embodiment of the present invention.

One embodiment of the present invention provides for mounting a computing device comprising a touch screen LCD in a shipboard mount, as shown in FIG. 8. Another embodiment for a touch screen LCD with the shock isolation enclosure of the present invention is shown in FIGS. 9-11.

CONCLUSION

A system has been shown in the above embodiments for the effective implementation of a rear assembly with integrated shock-vibration protection and direct coupled rear heat sink. While various preferred embodiments have been shown and described, it will be understood that there is no intent to limit the invention by such disclosure, but rather, it is intended to cover all modifications and alternate constructions falling within the spirit and scope of the invention, as defined in the appended claims. For example, the present invention should not be limited by size, materials, environmental requirements, weight, total power, or specific manufacturing techniques. While the described embodiment shows a separately attached heat sink section on the rear cover, other embodiments may, for example, isolate the front portion including a bezel from shock and vibration in an analogous fashion.

The invention claimed is:

1. A shock/vibration isolation mount comprising:
   a rear enclosure;
   an electronics board;
   a heat sink directly coupled to one or more heat producing electronic elements in said electronics board, said heat sink having a first section to dissipate heat and a second, rear, section to absorb heat from said heat producing electronic elements; and
   cushioning material interposed between an outer perimeter of said rear section of said heat sink and a portion of said rear enclosure, where said cushioning material absorbs shock/vibration energy and provides for a ruggedized seal.

2. The mount of claim 1, wherein said electronics board is mounted on an electrically insulating platform.

3. The mount of claim 2, wherein said electrically insulating platform comprises polycarbonate.

4. The mount of claim 1, wherein said shock/vibration isolation mount is coupled to said rear enclosure by shoulder bolts and shock/vibration isolation washers.

5. A method for isolating shock/vibration from an electronics board, said method comprising the steps of:
   directly coupling a heat sink to one or more heat producing electronics elements in an electronics board, said heat sink having a first section to dissipate heat and a second, rear, section to absorb heat from said heat producing electronic elements; and
   interposing cushioning material between an outer perimeter of said rear section of said heat sink and a portion of a rear enclosure, where said cushioning material absorbs shock/vibration energy and provides a ruggedized seal.

6. The method of claim 5, wherein said electronics board is mounted on an electrically insulating platform.

7. The method of claim 6, wherein said electrically insulating platform comprises polycarbonate.

8. The method of claim 5, wherein said shock/vibration isolation mount is coupled to said rear enclosure by shoulder bolts and shock/vibration isolation washers.

9. A shock/vibration isolation mount for shock sensitive display electronics comprising:
   a rear enclosure for mounting said shock/vibration isolation mount in a vehicle;
   an electronics board comprising said shock sensitive electronics mounted on an electrically insulating platform;
   a heat sink directly coupled to one or more heat producing electronic elements in said electronics board, said heat sink having a first section to dissipate heat and a second, rear, section to absorb heat from said heat producing electronic elements in said shock sensitive electronics; and
   cushioning material interposed between an outer perimeter of said rear section of said heat sink and a portion of said rear enclosure, where said cushioning material absorbs shock/vibration energy and provides for a ruggedized seal.

10. The mount of claim 9, wherein said vehicle is a naval ship.

11. The mount of claim 9, wherein said cushioning material provides sufficient shock isolation to pass a MIL-S-901D shock test.

\* \* \* \* \*